United States Patent
Regier et al.

(10) Patent No.: US 7,042,376 B1
(45) Date of Patent: May 9, 2006

(54) SCANNING FRONT END USING SINGLE-POLE, DOUBLE-THROW SWITCHES TO REDUCE SETTLING TIME

(75) Inventors: Christopher G. Regier, Austin, TX (US); Luis F. Orozco, Austin, TX (US)

(73) Assignee: National Instruments Corporation, Austin, TX (US)

( * ) Notice: Subject to any disclaimer, the term of this patent is extended or adjusted under 35 U.S.C. 154(b) by 0 days.

(21) Appl. No.: 11/134,716

(22) Filed: May 20, 2005

(51) Int. Cl.
*H03M 1/00* (2006.01)
(52) U.S. Cl. ...................................... 341/141; 341/155
(58) Field of Classification Search ................ 341/141, 341/155, 118, 120; 370/533, 534
See application file for complete search history.

(56) References Cited

U.S. PATENT DOCUMENTS

| | | | |
|---|---|---|---|
| 3,968,487 A * | 7/1976 | Herring et al. ............. | 341/141 |
| 4,016,557 A * | 4/1977 | Zitelli et al. ................ | 341/141 |
| 4,490,626 A | 12/1984 | Carlson | |
| 5,389,833 A | 2/1995 | Kay | |
| 6,433,722 B1 | 8/2002 | Gata et al. | |
| 6,707,405 B1 * | 3/2004 | Kuttner ...................... | 341/141 |
| 6,801,146 B1 * | 10/2004 | Kernahan et al. .......... | 341/141 |
| 2002/0027517 A1 | 3/2002 | Gata et al. | |
| 2003/0017809 A1 | 1/2003 | Garlepp et al. | |
| 2003/0034908 A1 | 2/2003 | Nestler et al. | |
| 2004/0248530 A1 | 12/2004 | Rakib et al. | |
| 2005/0035810 A1 | 2/2005 | Mulder et al. | |

OTHER PUBLICATIONS

Intersil, "Ultra Low ON-Resistance, Low Voltage, Single Supply, Quad SPDT (Dual DPDT) Analog Switch", Data Sheet, Nov. 5, 2004, http://www.intersil.com/data/fn/fn6094.pdf (11 Pages).

* cited by examiner

*Primary Examiner*—Rexford Barnie
*Assistant Examiner*—Lam T. Mai
(74) *Attorney, Agent, or Firm*—Meyertons Hood Kivlin Kowert & Goetzel, P.C.; Jeffrey C. Hood; Mario J. Lewin

(57) ABSTRACT

A scanning front end of a measurement device using single-pole, double-throw switches (SPDT) to multiplex input signals into signal conditioning circuitry. The scanning front end may also include N input channels and N input resistors, which may be connected to the conditioning circuitry via N SPDT switches. The signal conditioning circuitry may include an inverting amplifier. The first output terminal of each of the SPDT switches is connected to the summing node of the inverting amplifier. The summing node of the inverting amplifier may remain at zero volts and an amplifier side of each of the N input resistors may remain at zero volts, which may eliminate large common mode voltage swings and reduce a settling time of the amplifier when switching from one channel to another. Also, a voltage drop across each of the N input resistors may be equal to an input voltage of a corresponding input channel.

24 Claims, 3 Drawing Sheets

SCANNING FRONT END USING SINGLE-POLE, DOUBLE-THROW SWITCHES TO REDUCE SETTLING TIME

BACKGROUND OF THE INVENTION

1. Field of the Invention

The present invention relates generally to measurement and instrumentation systems and, more specifically, to a scanning front end using single-pole, double-throw (SPDT) switches to multiplex input signals.

2. Description of the Related Art

Scientists and engineers often use measurement systems to perform a variety of functions, including measurement of a physical phenomena or unit under test (UUT), test and analysis of physical phenomena, process monitoring and control, control of mechanical or electrical machinery, data logging, laboratory research, and analytical chemistry, to name a few examples.

A typical measurement system comprises a computer system with a measurement device or measurement hardware. The measurement device may be a computer-based instrument, a data acquisition device or board, a programmable logic device (PLD), an actuator, or other type of device for acquiring or generating data. The measurement device may be a board or module plugged into one of the I/O slots of the computer system, or a board or module plugged into a chassis, or an external device. Generally, the computer system has an I/O bus and connectors or slots for receiving I/O boards. Various computer systems and I/O buses may be used to implement a processing system for receiving the measurements. The computer may receive measurements from multiple sources, where, for example, different sources may interface with the computer through respective input and output measurement modules.

A measurement system may typically include transducers, sensors, or other detecting means for providing "field" electrical signals representing a process, physical phenomena, equipment being monitored or measured, etc. The field signals are provided to the measurement hardware. In addition, a measurement system may also typically include actuators for generating output signals for stimulating a UUT.

Measurement systems, which may also be generally referred to as data acquisition systems, may include the process of converting a physical phenomenon (such as temperature or pressure) into an electrical signal and measuring the signal in order to extract information. PC-based measurement and data acquisition (DAQ) systems and plug-in boards are used in a wide range of applications in the laboratory, in the field, and on the manufacturing plant floor.

In a measurement or data acquisition process, analog signals may be received by a digitizer, which may reside in an analog input module of a DAQ system. The analog signals may be received from a sensor, converted to digital data (possibly after being conditioned) by an analog-to-digital converter (ADC), and transmitted to a computer system for storage and/or analysis. In addition, the computer system may generate digital signals that are provided to one or more digital to analog converters (DACs) in an analog output module of the DAQ system. The DACs convert the digital signal to an analog output signal that is used, e.g., to stimulate a UUT.

Most scanning front ends on analog input modules use some type of "N to 1" multiplexer followed by a signal conditioning stage (usually an operational amplifier). There are at least two drawbacks to this topology. First, multiplexers have some parasitic capacitance associated with their output node. When switching from one channel to the next, this capacitance transfers charge between channels. This charge transfer may cause the equivalent input impedance of the multiplexer to decrease as the sampling frequency increases. Second, since the voltage at the output of the multiplexer may be changing as different channels are selected, the common mode voltage at the signal conditioning stage may follow these input voltages. The common mode voltage following the input voltages may prevent the signal conditioning circuitry, e.g., the amplifier, from settling quickly when switching from one channel to another.

SUMMARY OF THE INVENTION

Various embodiments of a scanning front end of a measurement device using single-pole, double-throw switches (SPDT) are disclosed. In one embodiment, the measurement device may be a data acquisition module comprised in a data acquisition system. In one embodiment, the data acquisition module may be a reconfigurable input/output (RIO) module. The SPDT switches may form a multiplexing device to multiplex input signals received at the measurement device.

In one embodiment, the measurement device may include N input channels, signal conditioning circuitry, an N to 1 multiplexing device, and N input resistors. The N to 1 multiplexing device may be connected to the N input channels and the signal conditioning circuitry. The N to 1 multiplexing device may include N single-pole, double throw (SPDT) switches, each of the SPDT switches connected to an input channel. Each of the SPDT switches may include an input terminal, a first output terminal, and a second output terminal. In addition, each of the SPDT switches may toggle between a first position to connect to the first output terminal and a second position to connect to the second output terminal. The first output terminal of each of the SPDT switches may be coupled to the signal conditioning circuitry and to the first output terminals of the remaining SPDT switches. Also, the second output terminal of each of the SPDT switches may be coupled to ground. Furthermore, each of the N input resistors may be coupled to an input channel, and the input terminal of each of the SPDT switches may be connected to an input resistor.

In one embodiment, the SPDT switches may multiplex input signals received at the input channels of the measurement device into the signal conditioning circuitry. In response to one or more control signals being received at the multiplexing device, the SPDT switch corresponding to the first input channel may toggle to the first position to connect to the signal conditioning circuitry and the remaining SPDT switches may toggle to the second position to connect to ground.

In one embodiment, the signal conditioning circuitry may include an inverting amplifier having an inverting input terminal, a non-inverting input terminal, and an output terminal. The N input resistors may be connected to the inverting amplifier via the multiplexing device. The first output terminal of each of the SPDT switches is connected to the inverting input terminal of the inverting amplifier. In one embodiment, the inverting input terminal of the inverting amplifier may remain at zero volts and an amplifier side of each of the N input resistors may remain at zero volts, which may eliminate large common mode voltage swings and reduce a settling time of the inverting amplifier when switching from one channel to another. Also, in one embodiment, a voltage drop across each of the N input resistors may be equal to an input voltage of a corresponding input channel. Furthermore, the N input resistors may have large resistance values which may allow the device to input large voltages without damaging the components of the device.

In one embodiment, the multiplexing device may include one or more extra SPDT switches in addition to the N SPDT switches. The one or more additional SPDT switches may be used to perform other functions instead of multiplexing input signals into the conditioning circuitry. For example, the one or more additional SPDT switches may be used for self-calibration of the measurement device or measuring noise of the measurement device.

BRIEF DESCRIPTION OF THE DRAWINGS

A better understanding of the present invention may be obtained when the following detailed description is considered in conjunction with the following drawings, in which.

Figure 1:
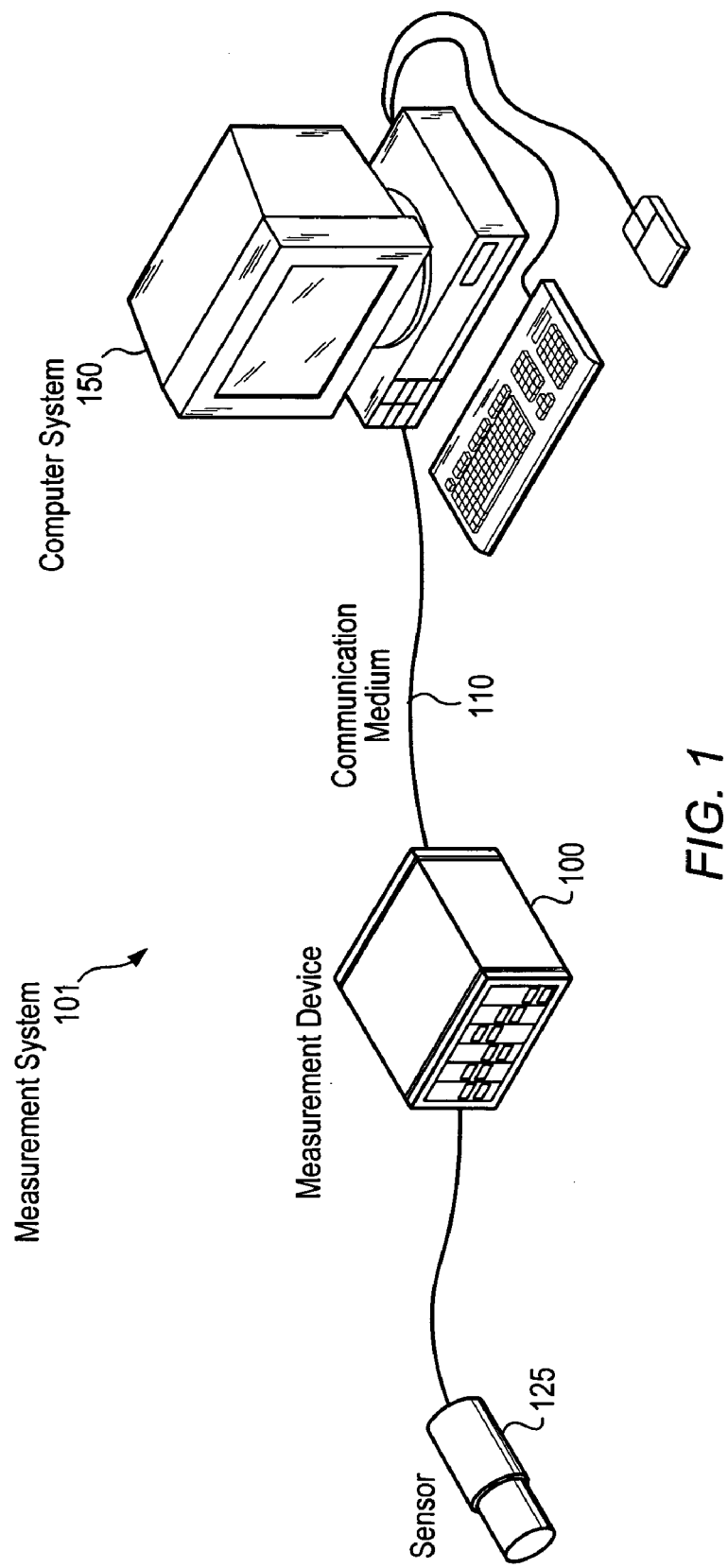
FIG. 1 is a diagram of one embodiment of a computer-based measurement or data acquisition system.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must). The term "include", and derivations thereof, mean "including, but not limited to". The term "coupled" means "directly or indirectly connected".

DETAILED DESCRIPTION

U.S. patent application Ser. No. 10/195,051 and Publication No. 2003/0074489 titled "Measurement System with Modular Measurement Modules That Convey Interface Information" filed on Jul. 12, 2002 whose inventors are Perry Steger, Garritt W. Foote, David Potter, and James J. Truchard is hereby incorporated by reference in its entirety as though fully and completely set forth herein.

Measurement System

FIG. 1 is a diagram of one embodiment of a computer-based measurement or data acquisition system 101. The measurement system 101 may include a computer system 150 (e.g., a host computer) coupled to a measurement device or data acquisition device 100. In one embodiment, the measurement device 100 may include a carrier and one or more measurement modules. As used herein, the term "measurement device" is intended to include any of various types of devices that are operable to acquire, generate, and/or store data, which may optionally be further operable to analyze or process the acquired or stored data. Examples of a measurement device include various types of instruments, such as oscilloscopes, multimeters, data acquisition devices or cards, devices external to a computer that operate similarly to a data acquisition cards, smart sensors, one or more DAQ or input measurement modules in a chassis, and other similar types of devices.

The measurement device 100 may in turn couple to or comprise a sensor or actuator 125, such as a pressure or temperature sensor, a thermocouple, an imaging device, (e.g. a camera), or any other type of sensor or actuator. In one example, the sensor 125 may be a temperature sensor, which is comprised in a unit under test (UUT). In this example, the measurement device 100 may receive a temperature reading from the temperature sensor and convert the analog data to digital form to be sent to the computer system 150 for analysis. In another example, the computer system 150 may send data to the measurement device 100 for various purposes, such as for use in generating analog signals used for stimulating the sensor 125 and/or the UUT.

The computer system 150 may couple to the measurement device 100 through a serial bus, such as a USB (Universal Serial Bus), or any other communication medium 110 including Ethernet, wireless media such as IEEE 802.11 (Wireless Ethernet), a network such as a Control Area Network (CAN) or the Internet, serial or parallel buses, or any other transmission means. The computer system 150 may comprise a CPU, a display screen, memory, and one or more input devices such as a mouse or keyboard. The computer system 150 may operate with the measurement device 100 to analyze or measure data from the sensor 125 and/or measurement device 100 or to control the sensor 125 and/or measurement device 100.

The computer system 150 may include a processor, which may be any of various types, including an x86 processor, e.g., a Pentium™ class, a PowerPC™ processor, a CPU from the SPARC™ family of RISC processors, as well as others. Also, the computer system 150 may also include one or more memory subsystems (e.g., Dynamic Random Access Memory (DRAM) devices). The memory subsystems may collectively form the main memory of computer system 150 from which programs primarily execute. The main memory may be operable to store a user application and a driver software program. The user application may be executable by the processor to conduct the data acquisition/generation process. The driver software program may be executable by the processor to receive data acquisition/generation tasks from the user application and program the measurement device 100 accordingly.

Measurement Device

Figure 2:
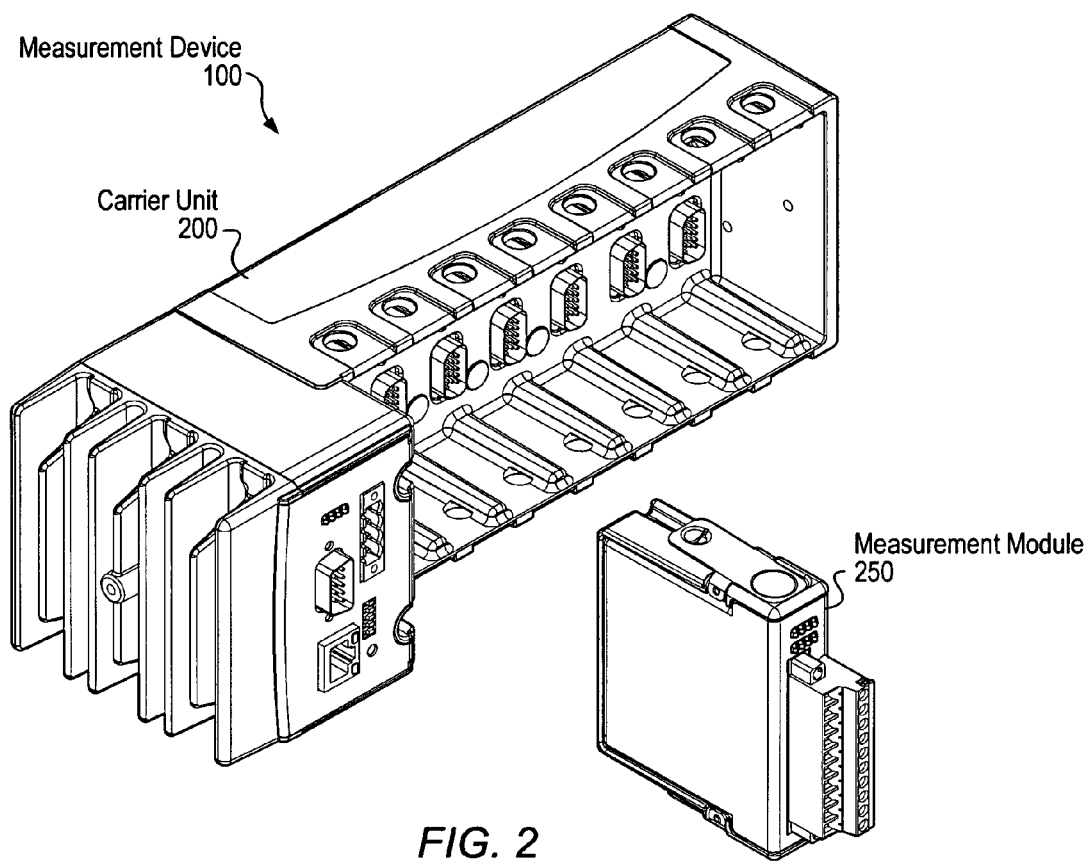
FIG. 2 is an isometric view of one embodiment of a measurement device including a carrier unit and one or more measurement modules.

FIG. 2 is an isometric view of one embodiment of a measurement device 100 including a carrier unit 200 and one or more measurement modules 250. As described above, the measurement device 100 may be included in the measurement and data acquisition system 101 of FIG. 1. The carrier unit 200 is operable to receive interface protocol information from the measurement module 250 specifying how to operate or interface with the measurement module 250. In one embodiment, the carrier unit 200 may then communicate the interface protocol information to the corresponding computer system, e.g., computer system 150 of FIG. 1. Alternatively, the measurement module 250 may communicate the interface protocol information directly to the computer system. Based on the interface protocol information, the computer system may program or configure the carrier unit 200 to implement the interface as specified by the measurement module 250. In other words, the measurement module 250 may tell the carrier 200 how to "talk" with it, and the carrier 200 may then tell the computer system how to program the carrier 200 to communicate with the measurement module 250 accordingly (or the measurement module 250 may tell the computer system directly how to program the carrier 200). The computer system may then program the carrier 200, thereby implementing the interface specified in the interface protocol information communicated by the measurement module 250. This process may be referred to as initialization of the measurement module/carrier. The configured carrier 200 and the measurement module 250 may then be operable to perform measurement and data acquisition operations using the sensor and/or the computer system.

In one embodiment, the measurement module 250 may be in the form of a measurement cartridge and the carrier 200 in the form of a cartridge carrier which is operable to receive one or more of the measurement cartridges. For example, the carrier unit 200 may comprise a chassis, a backplane comprised in the chassis providing for electrical communication, and one or more slots comprised in the chassis. Each of the one or more slots may include a connector that is coupled to the backplane, where each of the one or more slots may be adapted for receiving a measurement module 250. Thus, the carrier 200 may host a plurality of measurement cartridges, each of which may provide measurement and/or control functionality for a measurement or control operation or task. The carrier 200 may be operable to communicate with each measurement cartridge (i.e., module) and be programmed or configured (e.g., by the computer system or by a processor on the carrier 200) to implement the respective interface of each measurement cartridge. In this manner a suite of sensors may be fielded, each of which feeds signals to a respective measurement cartridge which in turn communicates through a respective interface (protocol) with the cartridge carrier. The cartridge carrier may in turn couple to a computer system. Thus, the carrier 200 may support a heterogeneous plurality of interfaces without having to include a heterogeneous set of interface hardware components.

The measurement modules 250 (or cartridges) may be easily removed, added, and replaced. In other words, measurement modules 250 may be exchanged to change the configuration or capabilities of the measurement system, e.g., measurement system 101. In one embodiment, the measurement module 250 may be replaced without powering down the measurement system, i.e., the measurement module 250 may be "hot-plugged" into the carrier 200, where the measurement module 250 may communicate the interface protocol information to the carrier 200 upon attachment, and the carrier 200 is programmed in response, as described above. In another embodiment, the measurement module 250 and/or carrier 200 may require a reboot or reset after attachment to perform the described initialization. Thus, the interface circuitry (i.e., the measurement module 250) may be operable to communicate the interface protocol to the carrier unit 200 upon one or more of attachment of the measurement module 250 to the carrier unit 200, reset of the measurement module 250, reset of the carrier unit 200, reboot of the measurement module 250, and reboot of the carrier unit 200.

In one embodiment, the carrier unit 200 may be a reconfigurable I/O (RIO) carrier which may be configured to receive one or more RIO measurement modules (e.g., module 250). As used herein, the term "RIO" carrier refers to a carrier which includes reconfigurable hardware which is configurable with respective interface protocols for one or more measurement modules. In other words, a RIO carrier with multiple module slots may be configured with multiple interfaces for inserted measurement modules, such that each module's interface is implemented by the RIO carrier. For example, if three RIO modules with three different respective interfaces are inserted in three slots of the RIO carrier, then the RIO carrier may be configured to implement the three interfaces. Similarly, if multiple modules are sequentially inserted into and removed from a particular slot, the RIO carrier may be configured respectively for each module, i.e., sequentially. The RIO carrier may further be operable to couple to any of various products or platforms.

Measurement Module

Figure 3:
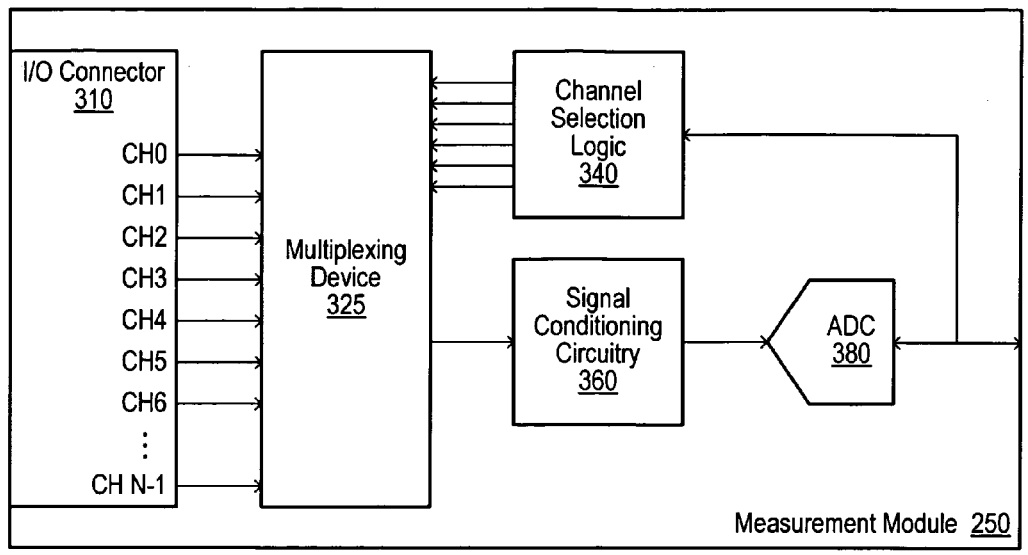
FIG. 3 is a block diagram of one embodiment of a measurement module comprising a scanning front end which includes a multiplexing device.

FIG. 3 is a block diagram of one embodiment of a measurement module 250 comprising a scanning front end which includes a multiplexing device 325. As described above, the measurement module 250 may be removably received in a carrier, e.g., carrier 200 of FIG. 2, and the measurement module 250 may be a RIO measurement module. Components that correspond to those shown in FIG. 1 and FIG. 2 are numbered identically for simplicity and clarity.

In one embodiment, the measurement module 250 may be an N-channel (e.g., CH0–CH N–1) analog input module including an input/output (I/O) connector 310, a multiplexing device 325, channel selection logic 340, signal conditioning circuitry 360, and an analog-to-digital converter (DAC) 380. The I/O connector 310 may be coupled to the multiplexing device 325, which may be connected to the signal conditioning circuitry 360. The channel selection logic 340 may be coupled to the multiplexing device 325 and the ADC 380 may be coupled to the signal conditioning circuitry 360.

The I/O connector 310 may receive one or more analog input signals via one or more of the N input channels from a source, e.g., the sensor 125 of FIG. 1. The I/O connector 310 may provide the input signals to the multiplexing device 325. The multiplexing device 325 may include N single-pole, double-throw (SPDT) switches. Each of the SPDT switches is connected to an input channel, which also includes N input resistors. The SPDT switches of the multiplexing device 325 may multiplex input signals received at the N input channels into, e.g., the signal conditioning circuitry 360, as will be further described below with reference to FIG. 4. The channel selection logic 340 may send control signals to the SPDT switches of the multiplexing device 325 to toggle each of the switches depending on which input channel is providing the input signal to the multiplexing device 325.

The signal conditioning circuitry 360 may condition the received analog input signals so that they may be converted to digital form by the ADC 380. In one embodiment, the signal conditioning circuitry 360 may include one or more amplifiers. For example, the signal conditioning circuitry 360 may include a network of components including an inverting amplifier. The ADC 380 may convert the received analog signals to digital form. In one embodiment, the ADC 380 may be connected to the carrier unit 200 of FIG. 2, which may be connected to the computer system 150 of FIG. 1. After the analog signals are conditioned and then converted to digital form, the ADC 380 may provide the digital signals to a computer system (e.g., computer system 150) for storage and/or analysis. It is noted however that in other embodiments the measurement module 250 may include two or more ADCs.

It should be noted that the components described with reference to FIG. 3 are meant to be exemplary only, and are not intended to limit the invention to any specific set of components or configurations. For example, in various embodiments, one or more of the components described may be omitted, combined, modified, or additional components included, as desired. For instance, in one embodiment the measurement module 250 may include a plurality of multiplexing devices, each including a plurality of SPDT switches.

Multiplexing Device

Figure 4:
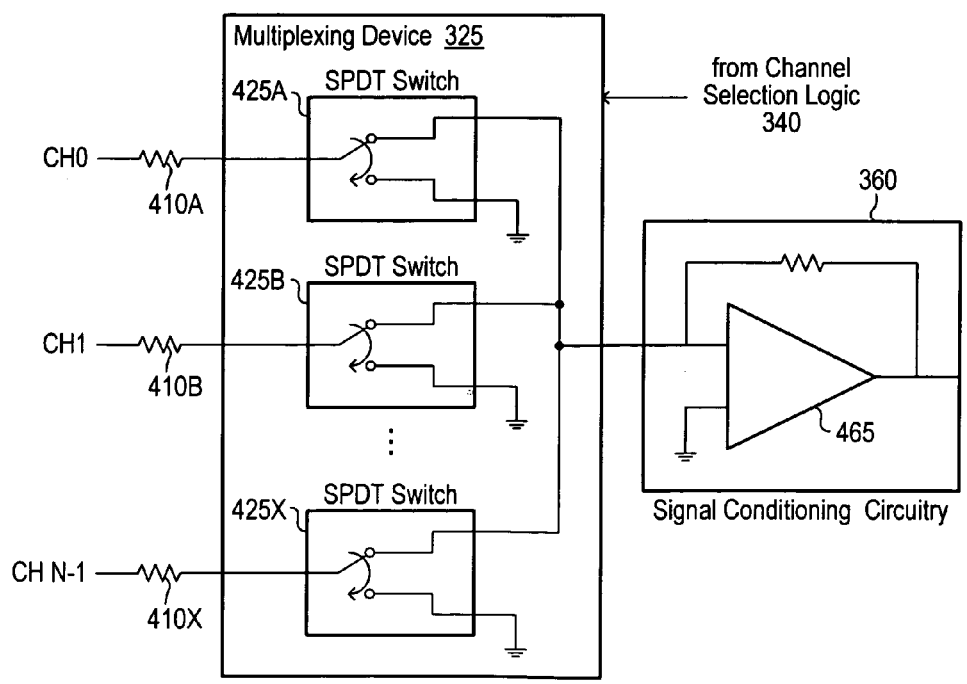
FIG. 4 is a block diagram of one embodiment of a multiplexing device including N single-pole, double-throw (SPDT) switches.

FIG. 4 is a block diagram of one embodiment of the multiplexing device 325 including N single-pole, double-throw (SPDT) switches 425. Components that correspond to those shown in FIGS. 1–3 are numbered identically for simplicity and clarity. The multiplexing device 325 may be formed by one or more integrated circuits (ICs), for example, one or more analog IC, which may be included in the scanning front end of a measurement module, e.g., the measurement module 250 of FIG. 3. It is noted however that in other embodiments the multiplexing device 325 may be included in other devices or boards. The SPDT switches 425 of the multiplexing device 325 may multiplex input signals received at the N input channels (e.g., CH0–CH N–1) into the signal conditioning circuitry 360.

The multiplexing device 325 may include N input channels and N SPDT switches 425A, 425B . . . 425X. Each of the SPDT switches 425 may be coupled to an input channel and may include an input terminal, a first output terminal, and a second output terminal. Each of the SPDT switches 425 may be configured to toggle or switch between a first position to connect to the first output terminal and a second position to connect to the second output terminal. In one embodiment, the first output terminal of each of the SPDT switches 425 may be connected to the signal conditioning circuitry and to the first output terminals of the remaining SPDT switches 425. For example, the first output terminal of the SPDT switch 425A may be connected to the signal conditioning circuitry 360 and to the first output terminals of the SPDT switches 425B–425X. Also, the second output terminal of each of the SPDT switches 425 may be coupled to ground. In addition, the input terminal of each of the SPDT switches 425 may be connected to N input resistors 410A, 410B . . . 410X. Each of the N input resistors 410 may be coupled to an input channel. It is noted however that in some embodiments the N input resistors 410 may be included within the multiplexing device 325. The signal conditioning circuitry 360 may include one or more amplifiers, e.g., the inverting amplifier 465.

It should be noted that the components described with reference to FIG. 4 are meant to be exemplary only, and are not intended to limit the invention to any specific set of components or configurations. For example, in various embodiments, one or more of the components described may be omitted, combined, modified, or additional components included, as desired. For instance, in one embodiment the multiplexing device 325 may be connected to other devices in addition or instead of the signal conditioning circuitry 360. Also, in some embodiments the number of resistors may vary, e.g., the resistor 410A may represent the combination of two resistors in series.

In one embodiment, an N-to-1 multiplexer (e.g., the multiplexing device 325) may be implemented by using N SPDT switches (e.g., switches 425). The output of the multiplexing device 325 may be connected to the signal conditioning circuitry 360, which in one embodiment may include at least one amplifier, e.g., the inverting amplifier 465. In one embodiment, the input resistor that is typically found on a traditional inverting amplifier is replaced with N individual input resistors (e.g., input resistors 410), which are coupled to the amplifier 465 via the multiplexing device 325 and the N input channels. The input resistors 410 may have relatively high resistance values, e.g., resistance values of at least 1 MΩ. It is noted however that in other embodiments the input resistors 410 may have resistance values of at least 500 kΩ. It is also noted however that in some embodiments the input resistor 410 may have any other resistance value.

In response to one or more control signals received at the multiplexing device 325, the SPDT switch (e.g., SPDT switch 425A) corresponding to the first channel (e.g., CH0) may toggle or switch to the first position to connect the first channel to the signal conditioning circuitry 360 and the remaining SPDT switches (SPDT switches 425B–425X) may toggle to the second position to connect the remaining channels to ground. The channel selection logic 340 may provide the control signals to control the toggling of the SPDT switches 425 from one position to another. It is noted that the SPDT switch 425 and one or more of the remaining SPDT switches may maintain their current position if the switches are already at the appropriate position. In one embodiment, when an input signal is received at one of the input channels, the channel selection logic 340 may send control signals to each of the SPDT switches 425 to toggle the switches 425 to the corresponding positions. In the example described above, the channel selection logic 340 may send a control signal to the SPDT switch 425A to toggle the SPDT switch 425A to the first position to route the input signal, e.g., from the I/O connector 310 to the signal conditioning circuitry 360 of FIG. 3. In this example, the channel selection logic 340 may also send control signals to each of the SPDT switches 425B–425X to toggle the SPDT switches to the second position. It is noted that in some embodiments the channel selection logic 340 may send control signals to the multiplexing device 325 in response to input signals being received in one or more of the channels. It is also noted that in other embodiment the control signals sent by the channel selection unit 340 may be independent of whether input signals are received in one or more of the channels. It is further noted that in still other embodiment the control signals may be manipulated in response to the behavior of the input signals.

As described above, the signal conditioning circuitry 360 may include the inverting amplifier 465. The inverting amplifier 465 includes an inverting input terminal and a non-inverting input terminal. In one embodiment, the non-inverting input terminal of the amplifier 465 may be connected to ground (e.g., 0V) and the inverting input terminal may be connected to the SPDT switches 425. Since the amplifier 465 may continuously adjust its output swing to maintain the node corresponding to the inverting input terminal (i.e., the summing node) at 0V, the first output terminals of the SPDT switches 425 may remain at a constant 0V. Therefore, both the summing node of the amplifier 465 and the amplifier side of all N input resistors 410 may be at 0V. The amplifier side of all N input resistors 410 may remain at 0V because the SPDT switches 425 are either connected to ground when in the second position or to the summing node of the amplifier 465 when in the first position. Also, since all of the first input terminals of the SPDT switches 425 are connected to the summing node of the amplifier, when the SPDT switches 425 change from the first position to the second position (or vise versa) the amplifier side of the input resistors 410 remain at 0V. This may eliminate the large common mode voltage swings that are typically present in traditional circuits that include a multiplexer and an inverting amplifier, for example, in traditional circuits the amplifier may have to settle from a 20V step when switching from one channel to another. In the embodiment illustrated in FIG. 4, even if there is a relatively large voltage difference when switching from one channel to another (e.g., 20V), the summing node of the amplifier 465 may remain at 0V even though current will flow through the channel. This may significantly reduce the settling time of the amplifier 465 compared to traditional configurations. In some embodiments, the summing node of the amplifier 465 may remain at approximately 0V±a few millivolts.

In the embodiment described above, the voltage across each of the input resistors 410 may be equal to the input voltage of the corresponding input channel. This is because one of the pins of the input resistors 410 may be connected to 0V, either by being connected directly to ground or by being connected to the inverting input of the amplifier 465 through the corresponding SPDT switch 425. Therefore, the input impedance seen by the signal source (e.g., the sensor 125 of FIG. 1) may remain constant regardless of the sampling rate or voltages present on the other channels. In addition, the charge injection may be near zero.

As described above the input resistors 410 may have relatively high resistance values, e.g., resistance values of at least 1 MΩ. Having a large resistor connected to zero volts at the front end of a device (e.g., the measurement module 250) may allow the device to input large voltages without damaging any of the components. For example, if the input resistors 410 are 1 MΩ resistors, applying 100V at the input will cause only 0.1 mA to flow through the input resistor 410, resulting in only 10 mW power dissipation. In one embodiment, the settling time of the amplifier 465 may be significantly reduced compared to traditional circuits even if large resistors are included at the input.

In one embodiment, the multiplexing device 325 may include one or more extra SPDT switches in addition to the N SPDT switches 425. For example, if the measurement module 250 is an 8-channel device, the multiplexing device 325 may include nine SPDT switches. In this embodiment, the extra switches may be used to perform other function instead of multiplexing input signals to condition the input signals, e.g., the extra SPDT switches may be used to measure noise in the measurement module or may be used for self-calibration of the measurement module. In one example, the noise inside the measurement module 250 may be measured without having to account for any external sources of noise. In this example, the input terminal of one of the extra SPDT switches may be connected to the module's internal ground. Therefore, the noise inside the measurement module 250 may be measured when this extra SPDT switch is multiplexed in. In another example, a self-calibration feature may be added to the measurement module 250 by receiving a calibration signal via one of the extra SPDT switches. In this example, an internal precision reference of the measurement module 250 may be connected to the input terminal of one of the extra SPDT switches. When the precision reference is multiplexed in, the self-calibration procedure may be performed.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A scanning front end in a measurement device, the scanning front end comprising:
   N input channels;
   signal conditioning circuitry;
   an N to 1 multiplexing device coupled to the N input channels and the signal conditioning circuitry, the N to 1 multiplexing device including:
     N single-pole, double throw (SPDT) switches, each of the SPDT switches coupled to an input channel, wherein each of the SPDT switches includes an input terminal, a first output terminal, and a second output terminal, wherein each of the SPDT switches is operable to toggle between a first position to couple to the first output terminal and a second position to couple to the second output terminal, wherein the first output terminal of each of the SPDT switches is coupled to the signal conditioning circuitry and to the first output terminals of the remaining SPDT switches, wherein the second output terminal of each of the SPDT switches is coupled to ground; and
     N input resistors, each of the input resistors coupled to an input channel, wherein the input terminal of each of the SPDT switches is coupled to an input resistor;
   wherein the SPDT switches are operable to multiplex input signals received at the input channels of the scanning front end into the signal conditioning circuitry.

2. The scanning front end of claim 1, wherein in response to receiving one or more control signals at the multiplexing device, the SPDT switch corresponding to a first input channel is operable to toggle to the first position to couple to the signal conditioning circuitry and the remaining SPDT switches are operable to toggle to the second position to couple to ground.

3. The scanning front end of claim 2, further comprising channel selection logic operable to provide the control signals to toggle the SPDT switches from one position to another.

4. The scanning front end of claim 1, wherein the signal conditioning circuitry includes at least one amplifier.

5. The scanning front end of claim 4, wherein the amplifier is an inverting amplifier including an inverting input terminal, a non-inverting input terminal, and an output terminal, wherein the N input resistors are coupled to the inverting amplifier via the multiplexing device.

6. The scanning front end of claim 5, wherein the first output terminal of each of the SPDT switches is coupled to the inverting input terminal of the inverting amplifier, wherein the inverting input terminal of the inverting amplifier remains at zero volts and an amplifier side of each of the N input resistors remains at zero volts thereby eliminating large common mode voltage swings and reducing a settling time of the inverting amplifier when switching from one channel to another.

7. The scanning front end of claim 1, wherein a voltage drop across each of the input resistors is equal to an input voltage of a corresponding input channel.

8. The scanning front end of claim 1, further comprising one or more extra SPDT switches in addition to the N SPDT switches, wherein the one or more additional SPDT switches are used to perform other functions instead of multiplexing input signals to condition the input signals.

9. The scanning front end of claim 8, wherein the one or more additional SPDT switches are used for self-calibration of the measurement device or measuring noise of the measurement device.

10. The scanning front end of claim 1, wherein the measurement device is a data acquisition device.

11. The scanning front end of claim 1, wherein the measurement device is a reconfigurable input/output (RIO) module.

12. A measurement device comprising:
N input channels;
signal conditioning circuitry;
an N to 1 multiplexing device coupled to the N input channels and the signal conditioning circuitry, the N to 1 multiplexing device including:
N single-pole, double throw (SPDT) switches, each of the SPDT switches coupled to an input channel, wherein each of the SPDT switches includes an input terminal, a first output terminal, and a second output terminal, wherein each of the SPDT switches is operable to toggle between a first position to couple to the first output terminal and a second position to couple to the second output terminal, wherein the first output terminal of each of the SPDT switches is coupled to the signal conditioning circuitry and to the first output terminals of the remaining SPDT switches, wherein the second output terminal of each of the SPDT switches is coupled to ground; and
N input resistors, each of the input resistors coupled to an input channel, wherein the input terminal of each of the SPDT switches is coupled to an input resistor;
wherein the SPDT switches are operable to multiplex input signals received at the input channels of the measurement device into the signal conditioning circuitry.

13. The measurement device of claim 12, wherein in response to receiving one or more control signals at the multiplexing device, the SPDT switch corresponding to a first input channel is operable to toggle to the first position to couple to the signal conditioning circuitry and the remaining SPDT switches are operable to toggle to the second position to couple to ground.

14. The measurement device of claim 13, further comprising channel selection logic operable to provide the control signals to toggle the SPDT switches from one position to another.

15. The measurement device of claim 12, wherein the signal conditioning circuitry includes at least one amplifier.

16. The measurement device of claim 15, wherein the amplifier is an inverting amplifier including an inverting input terminal, a non-inverting input terminal, and an output terminal, wherein the N input resistors are coupled to the inverting amplifier via the multiplexing device.

17. The measurement device of claim 16, wherein the first output terminal of each of the SPDT switches is coupled to the inverting input terminal of the inverting amplifier, wherein the inverting input terminal of the inverting amplifier remains at zero volts and an amplifier side of each of the N input resistors remains at zero volts thereby eliminating large common mode voltage swings and reducing a settling time of the inverting amplifier when switching from one channel to another.

18. The measurement device of claim 12, wherein a voltage drop across each of the input resistors is equal to an input voltage of a corresponding input channel.

19. The measurement device of claim 12, further comprising one or more extra SPDT switches in addition to the N SPDT switches, wherein the one or more additional SPDT switches are used to perform other functions instead of multiplexing input signals to condition the input signals.

20. The measurement device of claim 19, wherein the one or more additional SPDT switches are used for self-calibration of the measurement device or measuring noise of the measurement device.

21. The measurement device of claim 12, further comprising an analog-to-digital converter (ADC) coupled to the signal conditioning circuitry.

22. The measurement device of claim 12, wherein the measurement device is a reconfigurable input/output (RIO) module.

23. The measurement device of claim 12, wherein the measurement device is a data acquisition device comprised in a data acquisition system, wherein the data acquisition system further comprises a unit under test (UUT), wherein the UUT comprises a sensor operable to provide the data acquisition device with sensor data.

24. A measurement device comprising:
N input channels;
an inverting amplifier including an inverting input terminal, a non-inverting input terminal, and an output terminal;
an N to 1 multiplexing device coupled to the N input channels and the inverting amplifier, the N to 1 multiplexing device including:
N single-pole, double throw (SPDT) switches, each of the SPDT switches coupled to an input channel, wherein each of the SPDT switches includes an input terminal, a first output terminal, and a second output terminal, wherein each of the SPDT switches is operable to toggle between a first position to couple to the first output terminal and a second position to couple to the second output terminal, wherein the first output terminal of each of the SPDT switches is coupled to the inverting amplifier and to the first output terminals of the remaining SPDT switches, wherein the second output terminal of each of the SPDT switches is coupled to ground; and
N input resistors, each of the input resistors coupled to an input channel, wherein the N input resistors are coupled to the inverting amplifier via the multiplexing device, wherein the input terminal of each of the SPDT switches is coupled to an input resistor;
wherein the SPDT switches are operable to multiplex input signals received at the input channels of the measurement device into the inverting amplifier;
wherein in response to receiving one or more control signals at the multiplexing device, the SPDT switch corresponding to a first input channel is operable to toggle to the first position to couple to the inverting amplifier and the remaining SPDT switches are operable to toggle to the second position to couple to ground.

* * * * *